United States Patent [19]
Su et al.

[11] Patent Number: 5,843,804
[45] Date of Patent: Dec. 1, 1998

[54] METHOD OF MAKING AVALANCHE PHOTODIODES WITH EPITAXIALLY-REGROWN GUARD RINGS

[75] Inventors: Chung-Yi Su, Milpitas; Ghulam Hasnain, Stanford; James N. Hollenhorst, Saratoga, all of Calif.

[73] Assignee: Hewlett-Packard Company, Palo Alto, Calif.

[21] Appl. No.: 812,465

[22] Filed: Mar. 6, 1997

Related U.S. Application Data

[62] Division of Ser. No. 389,375, Feb. 16, 1995, Pat. No. 5,610,416.

[51] Int. Cl.⁶ ........................................ H01L 31/18
[52] U.S. Cl. ............................................... 438/91
[58] Field of Search ................... 438/91, 93, 94, 438/39, 41; 257/186, 438, 466

[56] References Cited

U.S. PATENT DOCUMENTS

| | | | |
|---|---|---|---|
| 4,651,187 | 3/1987 | Sugimoto et al. | 357/30 |
| 4,840,916 | 6/1989 | Yasuda et al. | 438/91 |
| 5,075,750 | 12/1991 | Kagawa | 357/30 |
| 5,157,473 | 10/1992 | Okazaki | 357/30 |
| 5,308,995 | 5/1994 | Tsuji et al. | 257/17 |
| 5,343,055 | 8/1994 | Davis et al. | 438/91 |

FOREIGN PATENT DOCUMENTS

| | | | |
|---|---|---|---|
| 1 298 640 | 4/1992 | Canada | H01L 31/10 |
| 0 163 546 | 4/1985 | European Pat. Off. | H01L 31/10 |
| 57-111073 | 7/1982 | Japan | H01L 31/10 |
| 60-226189 | 11/1985 | Japan | H01L 31/10 |

Primary Examiner—John Niebling
Assistant Examiner—S. Mulpuri

[57] ABSTRACT

A SAM avalanche photodiode formed with an epitaxially regrown guard ring and a planar P-N junction defined between a cap layer and a multiplication layer. The multiplication layer is part of a multi-layer semiconductor platform having a conductivity opposite to the conductivity type of the cap layer, including a light absorption layer, a substrate and an intermediate layer. A second embodiment of the present invention is disclosed including a SAM avalanche photodiode having a guard ring with a variable distribution of impurity dopant concentrations. In addition, a third embodiment of the present invention is disclosed in which a narrow band gap layer completely covers the cap layer and a non-alloy metal contact is formed to completely cover the narrow band gap layer, forming a mirror junction. In this embodiment, incident light is shined through the substrate and reflected from the mirror junction, enhancing the absorption efficiency.

8 Claims, 4 Drawing Sheets

METHOD OF MAKING AVALANCHE PHOTODIODES WITH EPITAXIALLY-REGROWN GUARD RINGS

CROSS REFERENCE TO RELATED APPLICATION(S)

This is a divisional of application Ser. No. 08/389,375 filed on Feb. 16, 1995 U.S. Pat. No. 5,610,416.

TECHNICAL FIELD

The present invention pertains to the field of avalanche photodiodes. Specifically, the invention pertains to a high-gain semiconductor avalanche photodiode.

BACKGROUND ART

An avalanche photodiode (APD) is a semiconductor device in which charge carriers are generated and multiplied when exposed to light. They are widely used in high speed communication. APDs operate under reverse bias with a high peak electric field close to breakdown. Incident photons in the appropriate wavelength range, i.e., 300–1600 nm, create charge carriers (electrons and/or holes) in the semiconductor material. Charge carriers are accelerated toward opposite electrodes by the large reverse bias. The accelerated carriers then produce secondary carriers by impact ionization within the semiconductor material. The resultant avalanche can produce gains in excess of $10^3$. APDs can improve the sensitivity of optical receivers by more than 10 dB.

For long wavelength applications, e.g., 1000–1600 nm wavelengths of light, a light absorption layer must be formed from a narrow band-gap semiconductor material. However, the large reverse bias typically creates excessive noise due to a large dark current flowing through the narrow band-gap material. To suppress this excessive noise, a separate layer having a wider band-gap is provided, allowing avalanche multiplication to take place. An APD constructed in this manner is commonly known as a separate absorption and multiplication (SAM) structure.

Generally, there are two types of SAM-APDs: planar structure or mesa structure. In the mesa structure SAM-APDs, the doping and thickness of the multiplication layer is controlled by epitaxial technology, providing precise control over the layer's thickness and impurity dopant concentration. Mesa structures, however, expose a high electric field region at the surface. The passivation of the surface has not been adequately demonstrated to date, and mesa structure APDs are, therefore, not favored.

Properly designed planar APDs exhibit lower electric fields at the surface of the structure than mesa structure APDs, and are commonly formed by diffusing p-type dopants into epitaxially grown n-type layers. The thickness of the multiplication layer is defined by the position of the diffused junction. FIG. 1 shows a prior art planar SAM-APD in which an n InP buffer layer 10, an n⁻ InGaAs light absorption layer 11, an n⁻ InGaAsP intermediate layer 12, an n avalanche InP multiplication layer 13, and an n⁻ InP window layer 14 are epitaxially grown in sequence on an n⁺ InP substrate 15. A p⁺ InP diffusion layer 16 and a p guard ring 17 are formed in the window layer 14 by selective diffusion or ion implantation techniques. A P-side electrode 18 is provided on the upper surface of the device, and an N-side electrode 19 is formed on the lower surface of the substrate 15.

In the SAM-APD thus formed, holes generated by light absorption in the n⁻ InGaAs layer 11 drift to the n InP layer 13 to initiate avalanche multiplication. Ideally, the APD is designed so that the field in the InGaAs layer 11 can be kept low enough to suppress the dark current. In the valence band of the heterojunction formed between the n⁻ InGaAs layer 11 and the n InP layer 13, holes generated in the n⁻ InGaAs layer 11 are accumulated. This reduces the response of the APD. To overcome this disadvantage, the n⁻ InGaAsP intermediate layer 12 is disposed between the n⁻ InGaAs layer 11 and the n InP layer 13.

To obtain high sensitivity, it is necessary to obtain uniform avalanche multiplication along the P-N junction 21. To that end, it is necessary to restrict the region of breakdown along the central portion of the APD, coextensive to a planar portion of the P-N junction 21. It has long been recognized that electric fields concentrate in the curved portion 20 of the P-N junction 21 between the n⁻ InP window layer 14 and the p⁺ InP layer 16. This field concentration can lead to premature breakdown at the curved portion 20, commonly known as edge breakdown.

To avoid edge breakdown, guard ring 17 is provided to surround the p⁺ InP layer 16. The guard ring 17 is formed so that it creates a second P-N junction 22 between both the window layer 14 and the multiplication layer 13. The second P-N junction is generally deeper than the P-N junction 21 to eliminate the curved portion 20.

In the prior art APD, described above, the n⁻ InP window layer 14 often has a low carrier concentration and is epitaxially grown on the n InP avalanche multiplication layer 13, which has a higher charge carrier concentration. P-N junction 22 is formed by selective diffusion, or implantation and annealing, at high temperatures of Be ions or the like into the window layer 14. P-N junction 21 is typically formed by selective diffusion of the p dopants of layer 16 into layer 14 using Cd or Zn as a diffusion source.

In order to achieve an APD with high gain-bandwidth product, P-N junction 21 is positioned as deep as possible near or within the avalanche multiplication layer 13. Further, to obtain a good response time, it is necessary to obtain a high concentration of dopants in the multiplication layer. This requires a high degree of control of both the doping and thickness of the multiplication layer 13 and the guard ring 17 in order to extract a sufficient quantity of photo-generated carriers to achieve the desired gain. Also, the electric field in the absorption layer must be kept low to avoid excessive dark current.

There have been many prior art attempts to suppress noise and increase gain by taking advantage of the aforementioned principles. U.S. Pat. No. 5,308,995 to Tsuji et al. discloses a superlattice APD having improved gain-bandwidth and ionization rate. The multiplication layer is formed by two or more types of semiconductor layers with differing band gaps. A tensile stress is applied to the barrier layers, i.e., semiconductor layers having the maximum band gap of the superlattice structure.

In U.S. Pat. No. 5,157,473 to Okzaki, an APD and a method for making such is disclosed, including epitaxially growing a window layer of n InP on an avalanche multiplication layer of n⁺ InP. The window layer is selectively removed to expose the avalanche multiplication layer, thereby providing a recessed portion. A p-type impurity is then selectively introduced into the window layer, forming a guard ring therein. A second implanting of p-type impurity is then achieved, forming a P-N junction and a guard ring having a gradient dopant concentration.

U.S. Pat. No. 5,075,750 to Kagawa discloses inter alia, an APD having improved RF characteristics. The APD includes a multi-layered structure with an InP layer, multiplication layer, a light-absorbing layer, a light-reflecting layer, and an electrode. The multiplication layer is arranged on one of the InP layers and comprises a superlattice in which $In_{0.52}Al_{0.48}As$ layers and $In_xGa_{1-x}As_yP_{1-y}$ layers to be lattice-matched with the $In_{0.52}Al_{0.48}AS$ layers are alternatively stacked, thereby improving the gain-bandwidth.

Canadian Patent No. 1,298,640 discloses a SAM-APD and a method for forming such in which a first and a second charge sheet are used to obtain independent control of the electric fields at the central and peripheral portions of the multiplication region and absorption region. The first charge sheet is located between the absorption region and a central portion of a P-N junction of the multiplication layer. The second charge sheet is located between the absorption region and the edges of the P-N junction. The second charge sheet has a lower dopant concentration than the first charge sheet.

The limitations of diffusion techniques for manufacturing APDs are manifest. The precision of diffusion is limited. For example, to achieve a multiplication gain-bandwidth of 100 GHz, a uniformly doped multiplication layer must have a thickness of about 0.7 μm with a required precision of about 4±0.02 μm. It is very difficult to achieve this degree of precision with diffusion technology. For similar reasons, it is difficult to accurately control the doping and position of the guard ring. This often leads to low fabrication yields and increased costs in the production of APDs. Low fabrication yield is a significant drawback in manufacturing an APD with high gain-bandwidth product.

What is needed is the precise control of the doping and thickness of the multiplication layer, the guard ring and an adjacent $p^+$-layer, of a mesa structure APD, while avoiding a very high electric field at the surface of the $p^+$-layer, as well as an edge breakdown at the interface of the $p^+$-layer and the multiplication layer.

DISCLOSURE OF THE INVENTION

A mesa structure APD, and a method for forming such, has a homogeneous $p^+$-type cap layer epitaxially grown above an n multiplication layer, defining a planar P-N junction therebetween, and at least one epitaxially regrown guard ring having a dopant concentration lower than that of the multiplication layer. The layered semiconductor structure includes a light absorption layer and the avalanche multiplication layer, both of which are of a negative-type conductivity. The guard ring is formed from the same semiconductor material as the cap layer that it surrounds. The guard ring is epitaxially regrown adjacent to both the cap layer and the multiplication layer, defining a second P-N junction, with respect to the multiplication layer, having a first and second planar portions with a curved portion positioned therebetween, distally positioned from the first P-N junction.

In another embodiment of the invention, a guard ring is epitaxially regrown in a single growth step to have a variable concentration of dopants. The guard ring may be grown so that the region adjacent to both the cap layer and the multiplication layer has a lower dopant concentration than either the cap layer or the multiplication layer. The remaining guard ring regions will generally have a dopant concentration equal to or greater than the multiplication layer.

In still another embodiment, a narrow band-gap semiconductor material is epitaxially grown over the cap layer, and a non-alloy metal contact is positioned adjacent to the narrow band-gap layer.

BEST MODE FOR CARRYING OUT THE INVENTION

Figure 1:
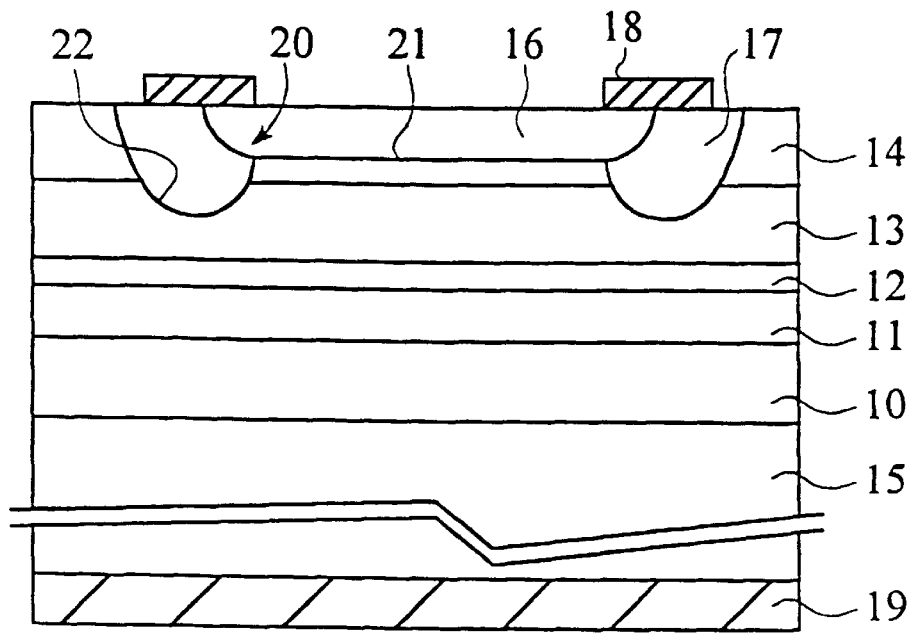
FIG. 1 is a cross sectional view showing a prior art avalanche photodiode.
Figure 2:
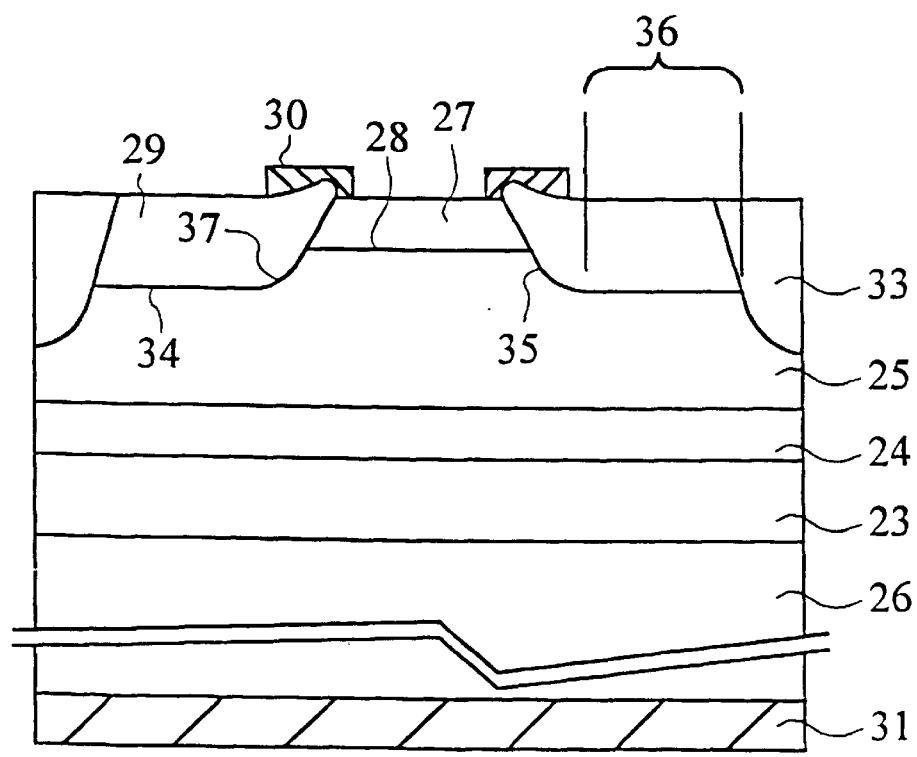
FIG. 2 is a cross sectional view showing an avalanche photodiode according to a first embodiment of the present invention.

FIG. 2 shows a SAM-APD in which an $n^-$ InGaAs light absorption layer 23, an $n^-$ InGaAsP intermediate layer 24 and an $n^+$ avalanche InP multiplication layer 25 are epitaxially grown in sequence on an $n^+$ InP substrate 26. A homogeneous $p^+$ InP cap layer 27 is grown on top of the multiplication layer 25, defining a planar P-N junction 28 therebetween. A guard ring 29 is epitaxially regrown adjacent to both the multiplication layer 25 and cap layer 27, defining a second P-N junction 34 at the interface between the guard ring 29 and the multiplication layer 25. A portion of the guard ring 29 is removed, exposing the $p^+$ cap layer 27, with the remaining portion of the guard ring surrounding the $p^{30}$ cap layer 27. In the preferred embodiment, the guard ring 29 is formed from the same semiconductor material as the $p^+$ cap layer 27, but it has a lower concentration of impurity dopants to reduce the electric field in that area. A P-side electrode 30 may be placed in contact with the cap layer 27. An N-side electrode 31 is formed on the lower surface of the semiconductor substrate 26. The electrodes may be annular or solid. For purposes of this application, the solid electrode would completely cover either the cap layer 27 or the substrate 26. If the electrodes were annular, each would define a centrally located aperture.

The absorption layer 23 and the intermediate layer 24 are considered intrinsic in the sense that no impurity dopants are intentionally added to them to alter their conductivity. In practice, however, they typically contain a low dopant concentration of an n-type impurity. The second P-N junction 34 includes a first and a second planar portions 35 and 36 and a curved portion 37. The first planar portion 35 is disposed adjacent to the first P-N junction 28, with the second planar portion 36 disposed adjacent and parallel to the multiplication layer 25. The curved portion 37 is distally positioned from the first P-N junction 28. In addition, the guard ring 29 will generally have a lower impurity dopant concentration than the multiplication layer 25. This structure substantially reduces the electric field proximate to the first P-N junction reducing the likelihood of edge breakdown, because there are no curved edges present. Placing the first P-N junction 28 adjacent to the multiplication layer 25 greatly reduces avalanche build-up time, thereby increasing the response speed of the present invention.

Figure 3A:
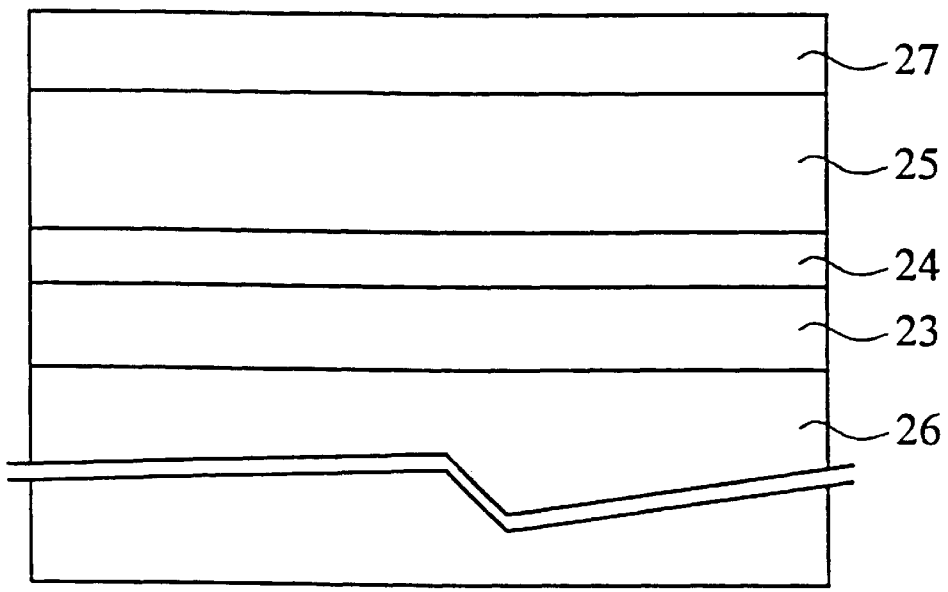
FIGS. 3A–3C are cross sectional views showing a process for forming the avalanche photodiode of FIG. 2.
Figure 3B:
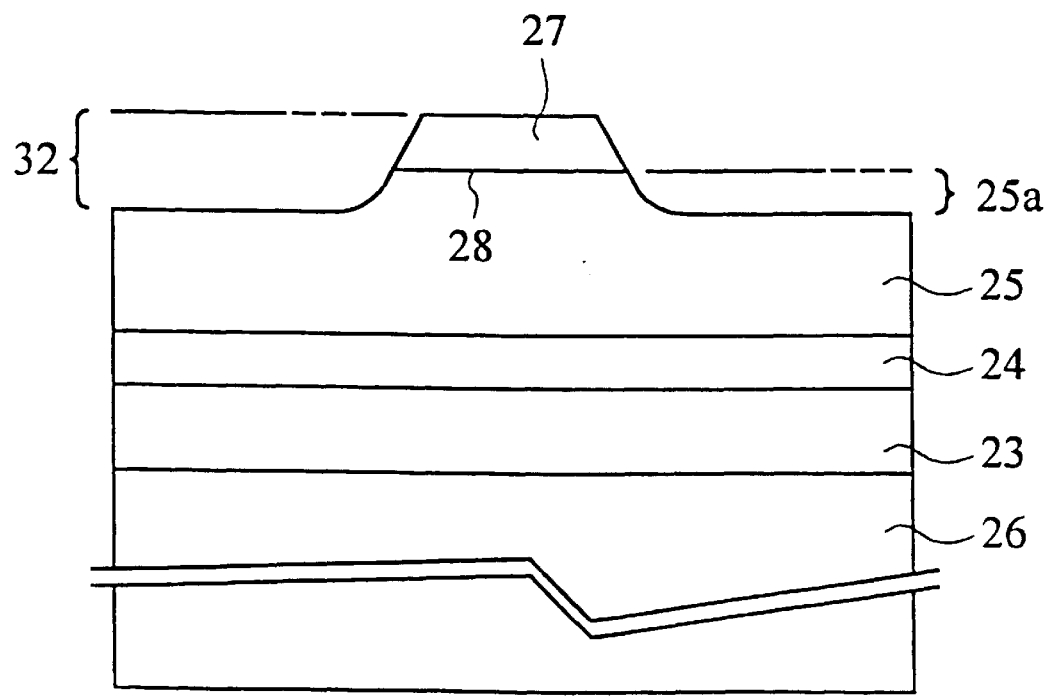
Figure 3C:
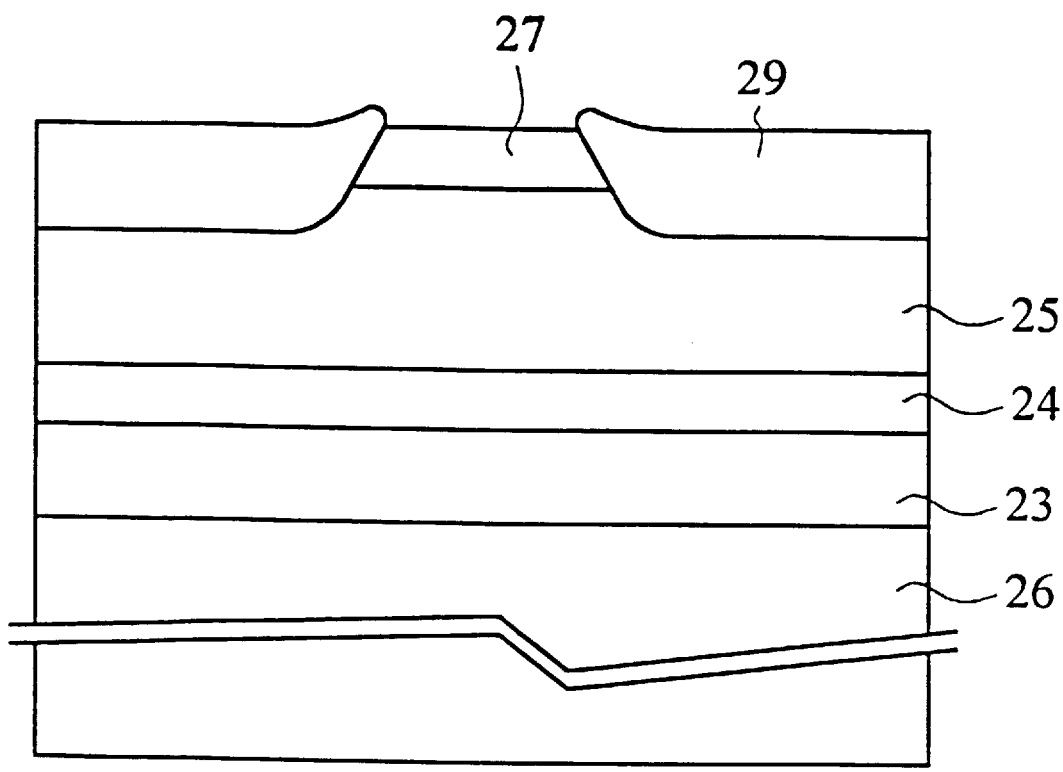

Referring to FIGS. 3A–3C, a method of forming the above-described avalanche photodiode is shown. FIG. 3A shows an $n^-$ InGaAs light absorption layer 23, an $n^-$ InGaAsP intermediate layer 24, an $n^+$ avalanche InP multiplication layer 25 and a $p^+$ InP cap layer 27 grown epitaxially in sequence on an $n^+$ InP substrate 26. FIG. 3B shows an etch performed to remove a section of the cap layer 27 and a portion of the multiplication layer 25. The etch step removes the entire cap layer 27, excepting the central portion, leaving a mesa structure 32 extending upwardly from the multiplication layer 25. The mesa structure 32 includes the entire cap layer 27, the entire upper portion 25a of the multiplication layer 25 and the entire first P-N junction 28 formed therebetween. The thickness of the mesa structure 32 is such that the electric field in the portion of intermediate layer 24 positioned beneath the etch region is equal to the electric field in the portion of the intermediate layer 24 beneath the mesa structure 32.

FIG. 3C shows the guard ring 29 epitaxially regrown, after the etch step. The guard ring is simultaneously grown adjacent to both the cap layer 27 and the multiplication layer 25. The regrowth step may be performed using any epitaxial deposition process, e.g., vapor phase epitaxy or molecular beam epitaxy. The guard ring 29 may be grown using non-selective overgrowth, wherein a portion of the guard ring is removed by an etch back of, for example, $H_3PO_4$:HCL:$CH_3COOH$ to expose the cap layer 27. Alternatively, guard ring 29 may be formed by selective growth, in which an $SiO_2$ mask (not shown) is formed over the cap layer before growing the guard ring 29. The $SiO_2$ is subsequently removed to expose the cap layer 27. Thereafter, the extent of the guard ring 29 may be further restricted by etching (not shown) or proton implantation 33 (FIG. 2). The P-side and N-side electrodes are then formed using conventional metal evaporation and lift-off techniques.

It is preferred to epitaxially regrow the guard ring 29 subsequent to forming the mesa structure 32. This allows forming an APD having a guard ring with a lower concentration of dopant impurities than an adjacent multiplication layer. It was recognized that the present diffusion techniques could not achieve this structure. Specifically, with diffusion technology, the greater the dopant concentration in the multiplication layer, the greater the dopant concentration must be in the guard ring to overcome the multiplication layer's conductivity. Otherwise, a P-N junction could not be produced adjacent to the multiplication layer. This greatly increases the electric field in the guard ring. The need to lower the impurity dopant concentration in the guard ring was recognized. This prompted etching away a portion of the multiplication layer and epitaxially regrowing the guard ring adjacent to it.

Figure 4:
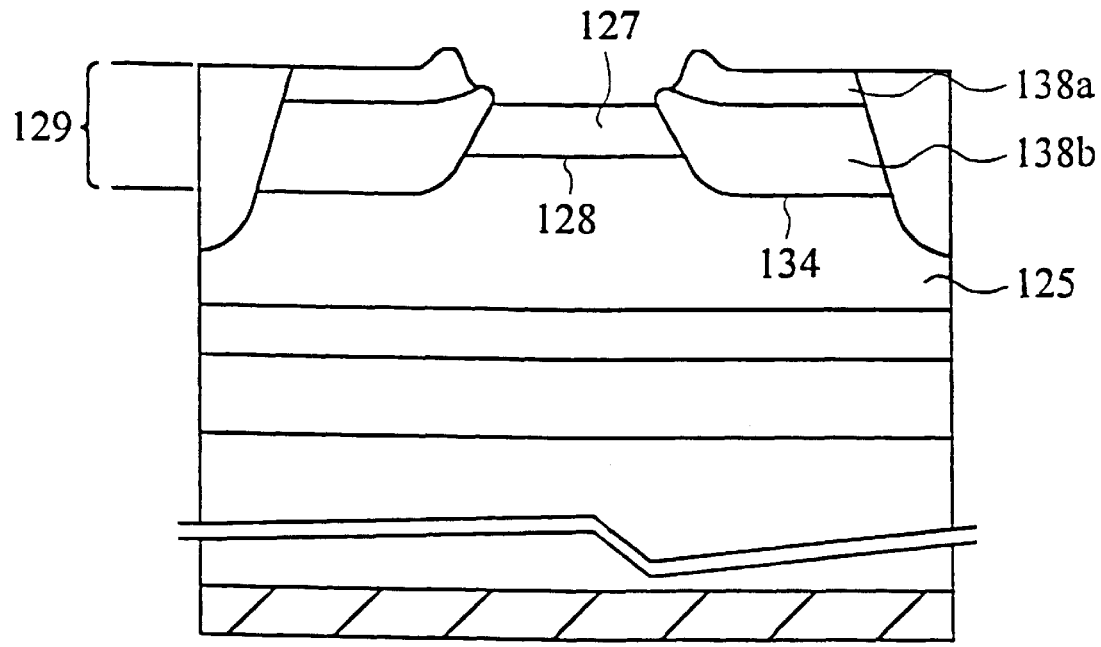
FIG. 4 is a cross sectional view showing an avalanche photodiode according to a second embodiment of the present invention.

FIG. 4 shows a second embodiment of the present invention, including guard ring 129 having variable distributions of dopant concentrations. Guard ring 129 is formed in one regrowth step using epitaxial growth techniques. The growth step is performed either as an overgrowth or a selective growth, as discussed above with respect to FIGS. 3A–3C. Using any epitaxial deposition process, any distribution of dopant concentrations may be produced. The only limit is the choice of design. For example, the impurity dopant concentration in region 138a may be higher or lower than that of region 138b, depending upon the application.

In the preferred embodiment, the impurity concentration of the p-type dopant in region 138b is less than the dopant concentration in either the cap layer 127 or the multiplication layer 125. The dopant concentration in region 138a is equal to or greater than the dopant concentration in the multiplication layer 125. This structure reduces the electric field in the second P-N junction 134. It also achieves uniform avalanche breakdown in the center of the APD defined by the region which is coextensive with the planar portion of the P-N junction 128. As discussed above, restricting breakdown to the center of the APD reduces noise and allows high gain while the low dopant concentration in region 138a reduces the surface field associated with prior art APDs having a mesa structure.

Figure 5:
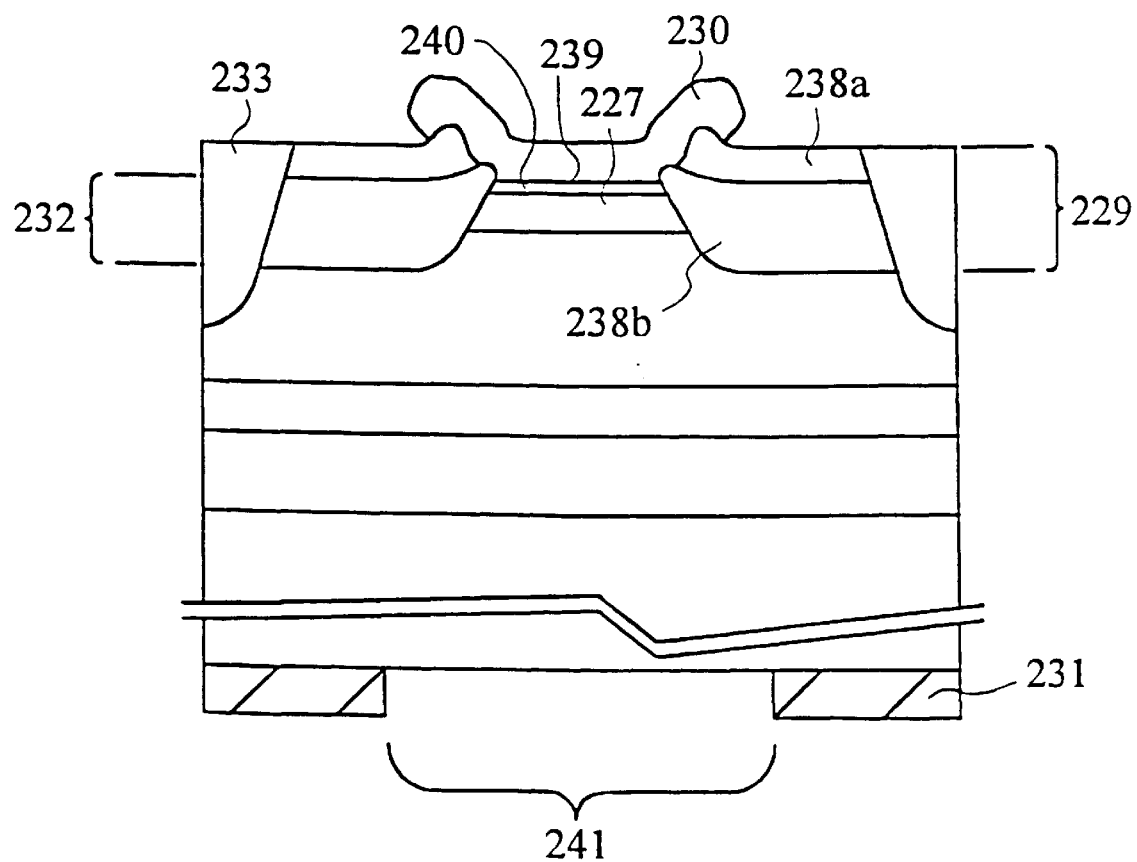
FIG. 5 is a cross sectional view showing an avalanche photodiode according to a third embodiment of the present invention.

FIG. 5 shows a third embodiment of the present invention. In addition to having a guard ring 239 with variable distributions of dopant concentrations shown as 238a and 238b, a layer of narrow band-gap p-type semiconductor material 240 is grown on top of the cap layer 227. Layer 240 may be disposed so as to have an aperture centrally located to expose a portion of the cap layer 227. In this manner, an annular P-side electrode would be disposed onto the APD. Alternatively, layer 240 may be disposed so as to completely cover the cap layer 227, as shown in FIG. 5. In this structure the P-side electrode would completely cover layer 240.

Narrow band-gap layer 240 may be disposed before forming the mesa structure 232, or following the formation of the mesa structure 232, discussed above with respect to FIGS. 3A–3C. Nonetheless, narrow band-gap p-type material 240 forms the uppermost portion of the mesa structure 232. After the regrowth of the guard ring 239, an ohmic contact 230 is formed, using conventional metal evaporation and lift-off techniques, over the narrow band-gap layer 240.

Typically, the narrow band-gap layer 240 is formed from InGaAs, because this is particularly suitable for forming a good electrical contact without necessitating alloy formation between the metal and the semiconductor material. It is highly desired to use a non-alloy ohmic contact. For purposes of this application, a non-alloy ohmic contact is one in which no inter diffusion occurs between the semiconductor material to which it is attached and the metal of the contact. Utilizing a non-alloy ohmic contact provides two advantages: 1) it simplifies the fabrication process, and 2) improves reflection properties at the metal-semiconductor interface.

As discussed above with respect to FIGS. 2 and 4, the contacts may be annular or solid. In the third embodiment, it is preferred to have the ohmic contact 230 completely covering the InGaAs layer 240, forming the P-side electrode. The interface of the InGaAs layer 240 and the ohmic contact 230 defines a mirror junction 239. The N-side electrode 231 is annular, defining an aperture 241 to permit back-side illumination.

The center of both the aperture 241 and the cap layer 227 lie along the same axis, i.e., they are concentric. In this manner, incident light shines through the substrate and is reflected by the mirror junction 239. This improves the absorption efficiency because charge carriers are created by both the incident light and the reflected light. As with the two embodiments described above, the extent of the guard ring 229 may be further restricted by etching (not shown) or proton implantation 233.

Although the above-described embodiments of the present invention relate to a semiconductor device formed of InGaAs/InP system compound semiconductor, the present invention can be applied to semiconductor devices formed from other materials, e.g., InAlAs/InGaAs, AlGaAsSb, GaAs and the like. In addition, the p-type layers and the n-type layers of the present invention may be replaced by n-type layers and p-type layers, respectively.

We claim:

1. A method of forming a guard ring on a semiconductor light detector, the method comprising:

providing a semiconductor platform having a multi-layer structure including a cap layer of a first conductivity type, and light absorption and avalanche multiplication layers of a second conductivity type, with the multiplication layer positioned proximate to the cap layer, defining a first P-N junction;

growing at least one epitaxial layer over the semiconductor platform, forming a guard ring surrounding the first P-N junction, wherin the growing step includes growing the guard ring with a dopant concentration lower than the doping concentration in multiplication layer and forming a mesa relief by etching the semiconductor platform to expose the first P-N junction.

2. The method as recited in claim 1 wherein the at least one epitaxial layer is simultaneously grown adjacent to both the cap layer and the multiplication layer.

3. The method as recited in claim 1 wherein the forming step includes forming a mesa relief including the cap layer, the entire first P-N junction and an upper portion of the multiplication layer and further including the step of exposing a surface of the cap layer.

4. The method as recited in claim 1 further including the steps of:

masking the cap layer of the mesa relief before growing the guard ring; and removing the mask after growing the guard ring.

5. The method as recited in claim 1 wherein the growing step includes growing the guard ring with a variable concentration of dopants.

6. The method as recited in claim 5 further including the step of growing an InGaAs layer of the first conductivity type atop the cap layer before forming the mesa relief.

7. The method as recited in claim 5 wherein the step of growing the guard ring includes growing a guard ring of a first semiconductor material of the first conductivity type having a first region adjacent to both the cap layer and the multiplication layer with a first dopant concentration, and a second region having a second dopant concentration with the cap layer being formed from the first semiconductor material having a third dopant concentration, wherein the first dopant concentration is lower than the second dopant concentration and the second dopant concentration is at least as concentrated as the third dopant concentration.

8. The method as recited claim 5 wherein the step of growing the guard ring includes growing a guard ring of a first semiconductor material of the first conductivity type having a first region adjacent to both the cap layer and the multiplication layer, with a dopant concentration, and a second region having a second dopant concentration with the cap layer being formed from the first semiconductor material having a third dopant concentration, wherein the second dopant concentration is lower than the first dopant concentration and the first dopant concentration is lower than the third dopant concentration.

\* \* \* \* \*